United States Patent
Maxwell et al.

(10) Patent No.: US 9,401,475 B1
(45) Date of Patent: Jul. 26, 2016

(54) METHOD FOR SILVER DEPOSITION FOR A NON-VOLATILE MEMORY DEVICE

(71) Applicant: Crossbar, Inc., Santa Clara, CA (US)

(72) Inventors: Steven Patrick Maxwell, Sunnyvale, CA (US); Sung-Hyun Jo, Santa Clara, CA (US); Scott Brad Herner, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/546,926

(22) Filed: Nov. 18, 2014

Related U.S. Application Data

(60) Continuation-in-part of application No. 13/620,012, filed on Sep. 14, 2012, now Pat. No. 8,889,521, and a continuation-in-part of application No. 14/109,415, filed on Dec. 17, 2013, which is a continuation of (Continued)

(51) Int. Cl.
*H01L 45/00* (2006.01)
*H01L 27/24* (2006.01)

(52) U.S. Cl.
CPC ........ *H01L 45/1608* (2013.01); *H01L 27/2436* (2013.01); *H01L 27/2463* (2013.01); *H01L 45/1253* (2013.01); *H01L 45/1675* (2013.01)

(58) Field of Classification Search
CPC . H01L 45/122; H01L 45/1233; H01L 45/124; H01L 45/1246; H01L 45/1253; H01L 45/126; H01L 45/1266; H01L 45/1273; H01L 45/16–45/1691

USPC .......... 257/1–8, 528–530, 536–543, 257/E45.001–E45.006; 438/382–385, 438/584–688
See application file for complete search history.

(56) References Cited

U.S. PATENT DOCUMENTS

| 680,652 A | 8/1901 | Elden |
|---|---|---|
| 4,433,468 A | 2/1984 | Kawamata |

(Continued)

FOREIGN PATENT DOCUMENTS

| EP | 2405441 | 1/2012 |
|---|---|---|
| EP | 2408035 | 1/2012 |

(Continued)

OTHER PUBLICATIONS

Jo et al., "Si-Memristive Devices Applied to Memory and Neuromorphic Circuits", Proceedings of 2010 IEEE International Symposium on Circuits and Systems, 2010, pp. 13-16.

(Continued)

*Primary Examiner* — Eric Ward
(74) *Attorney, Agent, or Firm* — Amin, Turocy & Watson, LLP

(57) ABSTRACT

A method of depositing a silver layer includes forming a plurality of openings in a dielectric layer to expose a top surface of a structure comprising a resistive memory layer on top of a p-doped silicon-containing layer on top of a conductive structure, depositing a first metal layer comprising a tungsten layer overlying the top surface of the structure, wherein a first metal material of the first metal layer contacts a resistive memory material of the resistive memory layer and exposing the first metal layer in a bath comprising a solution of silver species having an alkaline pH for a predetermined time to form a silver metal layer from the silver species from the solution overlying the resistive memory material, wherein the silver species is reduced by the first metal material, and wherein the first metal material is solubilized while forming the silver metal layer.

20 Claims, 4 Drawing Sheets

Related U.S. Application Data application No. 13/733,828, filed on Jan. 3, 2013, now Pat. No. 8,659,003, which is a division of application No. 12/861,666, filed on Aug. 23, 2010, now Pat. No. 8,404,553, application No. 14/546,926, which is a continuation-in-part of application No. 14/455,822, filed on Aug. 8, 2014, which is a division of application No. 13/246,115, filed on Sep. 29, 2011, now Pat. No. 8,841,196.

(60) Provisional application No. 61/387,963, filed on Sep. 29, 2010.

(56) References Cited

U.S. PATENT DOCUMENTS

| | | | |
|---|---|---|---|
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,538,564 | A | 7/1996 | Kaschmitter |
| 5,541,869 | A | 7/1996 | Rose et al. |
| 5,594,363 | A | 1/1997 | Freeman et al. |
| 5,614,756 | A | 3/1997 | Forouhi et al. |
| 5,645,628 | A * | 7/1997 | Endo et al. ............ 106/1.23 |
| 5,707,487 | A | 1/1998 | Hori et al. |
| 5,714,416 | A | 2/1998 | Eichman et al. |
| 5,751,012 | A | 5/1998 | Wolstenholme et al. |
| 5,840,608 | A | 11/1998 | Chang |
| 5,970,332 | A | 10/1999 | Pruijmboom et al. |
| 5,998,244 | A | 12/1999 | Wolstenholme et al. |
| 6,122,318 | A | 9/2000 | Yamaguchi et al. |
| 6,128,214 | A | 10/2000 | Huekes et al. |
| 6,143,642 | A | 11/2000 | Sur et al. |
| 6,180,998 | B1 | 1/2001 | Crafts |
| 6,259,116 | B1 | 7/2001 | Shannon |
| 6,291,836 | B1 | 9/2001 | Kramer et al. |
| 6,436,765 | B1 | 8/2002 | Liou et al. |
| 6,436,818 | B1 | 8/2002 | Hu et al. |
| 6,492,694 | B2 | 12/2002 | Noble et al. |
| 6,627,530 | B2 | 9/2003 | Li et al. |
| 6,762,474 | B1 | 7/2004 | Mills |
| 6,768,157 | B2 | 7/2004 | Krieger et al. |
| 6,815,286 | B2 | 11/2004 | Krieger et al. |
| 6,838,720 | B2 | 1/2005 | Krieger et al. |
| 6,848,012 | B2 | 1/2005 | LeBlanc et al. |
| 6,858,481 | B2 | 2/2005 | Krieger et al. |
| 6,858,482 | B2 | 2/2005 | Gilton |
| 6,864,127 | B2 | 3/2005 | Yamazaki et al. |
| 6,864,522 | B2 | 3/2005 | Krieger et al. |
| 6,881,994 | B2 | 4/2005 | Lee et al. |
| 6,927,430 | B2 | 8/2005 | Hsu |
| 6,939,787 | B2 | 9/2005 | Ohtake et al. |
| 6,946,719 | B2 | 9/2005 | Petti et al. |
| 7,020,006 | B2 | 3/2006 | Chevallier et al. |
| 7,023,093 | B2 | 4/2006 | Canaperi et al. |
| 7,026,702 | B2 | 4/2006 | Krieger et al. |
| 7,102,150 | B2 | 9/2006 | Harshfield et al. |
| 7,122,853 | B1 | 10/2006 | Gaun et al. |
| 7,187,577 | B1 | 3/2007 | Wang et al. |
| 7,221,599 | B1 | 5/2007 | Gaun et al. |
| 7,238,607 | B2 | 7/2007 | Dunton et al. |
| 7,254,053 | B2 | 8/2007 | Krieger et al. |
| 7,289,353 | B2 | 10/2007 | Spitzer et al. |
| 7,324,363 | B2 | 1/2008 | Kerns et al. |
| 7,365,411 | B2 | 4/2008 | Campbell |
| 7,405,418 | B2 | 7/2008 | Happ et al. |
| 7,426,128 | B2 | 9/2008 | Scheuerlein |
| 7,433,253 | B2 | 10/2008 | Gogl et al. |
| 7,474,000 | B2 | 1/2009 | Scheuerlein et al. |
| 7,479,650 | B2 | 1/2009 | Gilton |
| 7,499,355 | B2 | 3/2009 | Scheuerlein et al. |
| 7,521,705 | B2 | 4/2009 | Liu |
| 7,534,625 | B2 | 5/2009 | Karpov et al. |
| 7,541,252 | B2 | 6/2009 | Eun et al. |
| 7,550,380 | B2 | 6/2009 | Elkins et al. |
| 7,566,643 | B2 * | 7/2009 | Czubatyi et al. ............ 438/584 |
| 7,606,059 | B2 | 10/2009 | Toda |
| 7,615,439 | B1 | 11/2009 | Schricker et al. |
| 7,629,198 | B2 | 12/2009 | Kumar et al. |
| 7,719,001 | B2 | 5/2010 | Nomura et al. |
| 7,728,318 | B2 | 6/2010 | Raghuram et al. |
| 7,729,158 | B2 | 6/2010 | Toda et al. |
| 7,749,805 | B2 | 7/2010 | Pinnow et al. |
| 7,772,581 | B2 | 8/2010 | Lung |
| 7,778,063 | B2 | 8/2010 | Brubaker et al. |
| 7,786,464 | B2 | 8/2010 | Nirschl et al. |
| 7,786,589 | B2 | 8/2010 | Matsunaga et al. |
| 7,824,956 | B2 | 11/2010 | Schricker et al. |
| 7,829,875 | B2 | 11/2010 | Scheuerlein |
| 7,835,170 | B2 | 11/2010 | Bertin et al. |
| 7,858,468 | B2 | 12/2010 | Liu et al. |
| 7,859,884 | B2 | 12/2010 | Scheuerlein |
| 7,875,871 | B2 | 1/2011 | Kumar et al. |
| 7,881,097 | B2 | 2/2011 | Hosomi et al. |
| 7,897,953 | B2 | 3/2011 | Liu |
| 7,898,838 | B2 | 3/2011 | Chen et al. |
| 7,920,412 | B2 | 4/2011 | Hosotani et al. |
| 7,924,138 | B2 | 4/2011 | Kinoshita et al. |
| 7,968,419 | B2 | 6/2011 | Li et al. |
| 7,972,897 | B2 | 7/2011 | Kumar et al. |
| 7,984,776 | B2 | 7/2011 | Sastry et al. |
| 8,004,882 | B2 | 8/2011 | Katti et al. |
| 8,018,760 | B2 | 9/2011 | Muraoka et al. |
| 8,021,897 | B2 | 9/2011 | Sills et al. |
| 8,045,364 | B2 | 10/2011 | Schloss et al. |
| 8,054,674 | B2 | 11/2011 | Tamai et al. |
| 8,067,815 | B2 | 11/2011 | Chien et al. |
| 8,071,972 | B2 | 12/2011 | Lu et al. |
| 8,084,830 | B2 | 12/2011 | Kanno et al. |
| 8,088,688 | B1 | 1/2012 | Herner |
| 8,097,874 | B2 | 1/2012 | Venkatasamy et al. |
| 8,102,698 | B2 | 1/2012 | Scheuerlein |
| 8,143,092 | B2 | 3/2012 | Kumar et al. |
| 8,144,498 | B2 | 3/2012 | Kumar et al. |
| 8,164,948 | B2 | 4/2012 | Katti et al. |
| 8,168,506 | B2 | 5/2012 | Herner |
| 8,183,553 | B2 | 5/2012 | Phatak et al. |
| 8,187,945 | B2 | 5/2012 | Herner |
| 8,198,144 | B2 | 6/2012 | Herner |
| 8,207,064 | B2 | 6/2012 | Bandyopadhyay et al. |
| 8,227,787 | B2 | 7/2012 | Kumar et al. |
| 8,231,998 | B2 | 7/2012 | Sastry et al. |
| 8,233,308 | B2 | 7/2012 | Schricker et al. |
| 8,237,146 | B2 | 8/2012 | Kreupl et al. |
| 8,258,020 | B2 | 9/2012 | Herner |
| 8,265,136 | B2 | 9/2012 | Hong et al. |
| 8,274,812 | B2 | 9/2012 | Nazarian et al. |
| 8,315,079 | B2 | 11/2012 | Kuo et al. |
| 8,320,160 | B2 | 11/2012 | Nazarian et al. |
| 8,374,018 | B2 | 2/2013 | Lu |
| 8,385,100 | B2 | 2/2013 | Kau et al. |
| 8,389,971 | B2 | 3/2013 | Chen |
| 8,394,670 | B2 | 3/2013 | Herner |
| 8,399,307 | B2 | 3/2013 | Herner |
| 8,441,835 | B2 | 5/2013 | Jo et al. |
| 8,467,227 | B1 | 6/2013 | Jo et al. |
| 8,587,989 | B2 | 11/2013 | Manning et al. |
| 8,658,476 | B1 | 2/2014 | Sun et al. |
| 8,659,003 | B2 | 2/2014 | Herner et al. |
| 8,716,098 | B1 | 5/2014 | Herner et al. |
| 8,723,154 | B2 | 5/2014 | Jo et al. |
| 2003/0052330 | A1 | 3/2003 | Klein |
| 2003/0141565 | A1 | 7/2003 | Hirose et al. |
| 2003/0174574 | A1 | 9/2003 | Perner et al. |
| 2003/0206659 | A1 | 11/2003 | Hamanaka |
| 2004/0026682 | A1 | 2/2004 | Jiang |
| 2004/0170040 | A1 | 9/2004 | Rinerson et al. |
| 2004/0192006 | A1 | 9/2004 | Campbell et al. |

(56) References Cited

U.S. PATENT DOCUMENTS

| | | |
|---|---|---|
| 2004/0194340 A1 | 10/2004 | Kobayashi |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2007/0008773 A1 | 1/2007 | Scheuerlein et al. |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0242051 A1 | 10/2008 | Yamazaki et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0134432 A1 | 5/2009 | Tabata et al. |
| 2009/0152737 A1 | 6/2009 | Harshfield |
| 2009/0168486 A1 | 7/2009 | Kumar et al. |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0068373 A1 | 3/2011 | Minemura et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 * | 12/2011 | Jo et al. .................... 365/148 |
| 2011/0312151 A1 * | 12/2011 | Herner .................... 438/384 |
| 2011/0317470 A1 | 12/2011 | Lu et al. |
| 2012/0001145 A1 | 1/2012 | Magistretti et al. |
| 2012/0001146 A1 * | 1/2012 | Lu et al. ....................... 257/4 |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 * | 2/2012 | Herner et al. ................ 257/4 |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 * | 9/2012 | Ohba et al. ................ 365/148 |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0326265 A1 | 12/2012 | Lai et al. |
| 2013/0009128 A1 | 1/2013 | Ribeiro et al. |
| 2013/0020548 A1 | 1/2013 | Clark et al. |
| 2013/0264535 A1 | 10/2013 | Sonehara |

FOREIGN PATENT DOCUMENTS

| | | |
|---|---|---|
| JP | 2005506703 | 3/2005 |
| JP | 2006032951 | 2/2006 |
| JP | 2007067408 | 3/2007 |
| JP | 2007281208 | 10/2007 |
| JP | 2007328857 | 12/2007 |
| KR | 10-2011-0014248 | 2/2011 |
| WO | 03034498 | 4/2003 |
| WO | 2009005699 | 1/2009 |

OTHER PUBLICATIONS

Terabe et al, "Quantized Conductance Atomic Switch", Nature, vol. 433, Jan. 6, 2005, pp. 47-50, www.nature.com/nature.

Kim et al., "Nanoscale resistive memory with intrinsic diode characteristics and long endurance," Applied Physics Letters, 2010, pp. 053106-1-053106-3, vol. 96, American Institute of Physics.

(56) References Cited

OTHER PUBLICATIONS

Jafar et al., "Switching in Amorphous-Silicon Devices", The American Physical Society, 1994, pp. 611-615, vol. 49, No. 19.

Marand, "Materials Engineering Science", MESc 5025 lecture notes: Chapter 7, University of Vermont, http://www.files.chem.vt.edu/chemdeptimarand/MEScchap6-1c.pdf Last accessed on Dec. 12, 2015.

Kund, et al., "Conductive Bridging RAM (CBRAM): An Emerging Non-Volatile Memory Technology Scalable to Sub 20nm", IEEE, 2005.

Moopenn, et al., "Programmable Synaptic Devices for Electronic Neural Nets", Control and Computers, 1990, pp. 37-40, vol. 18, No. 2.

Muller et al., "The Electronic Structure at The Atomic Scale of Ultrathin Gate Oxides", Nature, Jun. 1998, pp. 758-761, vol. 399, No. 24.

Notice of Allowability for U.S. Appl. No. 12/861,650 dated Jun. 19, 2012, 7 pages.
Notice of Allowance for U.S. Appl. No. 13/118,258 dated Feb. 6, 2013, 9 pages.
Notice of Allowance for U.S. Appl. No. 13/314,513 dated Jan. 24, 2013, 5 pages.
Notice of Allowance for U.S. Appl. No. 12/939,824 dated Jul. 24, 2012, 5 pages.
Notice of Allowance for U.S. Appl. No. 13/158,231 dated Apr. 17, 2012, 7 pages.
Notice of Allowance for U.S. Appl. No. 13/532,019 dated Nov. 14, 2012, 8 pages.
Notice of Allowance for U.S. Appl. No. 12/582,086 dated Oct. 21, 2011, 8 pages.
Notice of Allowance for U.S. Appl. No. 12/814,410 dated Jan. 8, 2013, 8 pages.
Notice of Allowance for U.S. Appl. No. 12/833,898 dated May 30, 2012, 5 pages.
Notice of Allowance for U.S. Appl. No. 12/835,699 dated Feb. 6, 2012, 7 pages.
Notice of Allowance for U.S. Appl. No. 12/861,666 dated Nov. 14, 2012, 5 pages.
Notice of Allowance for U.S. Appl. No. 12/894,087 dated Oct. 25, 2012, 8 pages.
Notice of Allowance for U.S. Appl. No. 12/894,098 dated Mar. 15, 2013, 12 pages.
Notice of Allowance for U.S. Appl. No. 12/939,824 dated May 11, 2012, 8 pages.
Notice of Allowance for U.S. Appl. No. 12/940,920 dated Oct. 5, 2011, 8 pages.
Notice of Allowance for U.S. Appl. No. 13/149,807 dated Oct. 29, 2012, 8 pages.
Notice of Allowance for U.S. Appl. No. 13/174,264 dated Oct. 16, 2013, 7 pages.
Notice of Allowance for U.S. Appl. No. 13/290,024 dated Nov. 28, 2012, 9 pages.
Notice of Allowance for U.S. Appl. No. 13/417,135 dated Oct. 23, 2013, 11 pages.
Notice of Allowance for U.S. Appl. No. 13/452,657 dated Oct. 10, 2013, 10 pages.
Notice of Allowance for U.S. Appl. No. 13/468,201 dated Feb. 20, 2014, 10 pages.
Notice of Allowance for U.S. Appl. No. 13/679,976 dated Sep. 17, 2013, 8 pages.
Notice of Allowance for U.S. Appl. No. 13/725,331 dated Jan. 17, 2014, 8 pages.
Notice of Allowance for U.S. Appl. No. 13/733,828 dated Aug. 8, 2013, 9 pages.
Notice of Allowance for U.S. Appl. No. 13/748,490 dated Apr. 9, 2013, 8 pages.
Notice of Allowance for U.S. Appl. No. 13/769,152 dated Oct. 8, 2013, 9 pages.
Notice of Allowance for U.S. Appl. No. 13/905,074 dated Oct. 8, 2013, 10 pages.
Office Action for U.S. Appl. No. 13/620,012 dated Feb. 11, 2014, 33 Pages.
Office Action for Application No. EP11005207.3 mailed Aug. 8, 2012.
Office Action for U.S. Appl. No. No. 11/875,541, dated Jul. 22, 2010, 13 pages.
Office Action for U.S. Appl. No. 11/875,541, dated Jun. 8, 2012, 11 pages.
Office Action for U.S. Appl. No. 11/875,541, dated Mar. 30, 2011, 13 pages.
Office Action for U.S. Appl. No. 11/875,541, dated Oct. 5, 2011, 13 pages.
Office Action for U.S. Appl. No. 12/582,086 dated Apr. 19, 2011, 12 pages.
Office Action for U.S. Appl. No. 12/582,086 dated Sep. 6, 2011, 6 pages.
Office Action for U.S. Appl. No. 12/814,410 dated Apr. 17, 2012, 10 pages.
Office Action for U.S. Appl. No. 12/833,898 dated Apr. 5, 2012, 7 pages.
Office Action for U.S. Appl. No. 12/835,699 dated Aug. 24, 2011, 10 pages.
Office Action for U.S. Appl. No. 12/835,704 dated Mar. 14, 2014, 13 pages.
Office Action for U.S. Appl. No. 12/835,704 dated Jun. 8, 2012, 3 pages.
Office Action for U.S. Appl. No. 121835,704 dated Mar. 1, 2012, 14 pages.
Office Action for U.S. Appl. No. 12/835,704 dated Sep. 21, 2011, 13 pages.
Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Yuan et al., "Silicon Solar Cells wth Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/913,719 dated Mar. 12, 2012, 5 pages.
Notice of Allowance for U.S. Appl. No. 13/461,725 dated Nov. 13, 2013, 10 pages.
Notice of Allowance for U.S. Appl. No. 13/598,550 dated Mar. 20, 2014, 8 pages.
Office Action dated Dec. 6, 2013 for Appl. No. 13/564,639, 14 pages.
Office Action dated Mar. 19, 2013 for Appl. No. 13/564,639, 14 pages.
Office Action for U.S. Appl. No. 12/913,719 dated Feb. 17, 2011, 12 pages.
Office Action for U.S. Appl. No. 12/913,719 dated Jul. 22, 2011, 12 pages.
Office Action for U.S. Appl. No. 13/447,036 dated Jul. 9, 2013, 16 pages.
Office Action for U.S. Appl. No. 13/447,036 dated Mar. 21, 2014, 18 pages.
Notice of Allowance for U.S. Appl. No. 13/447,036 dated Sep. 25, 2014, 11 pages.
Office Action for U.S. Appl. No. 13/481,600 dated Sep. 20, 2013, 16 pages.
Office Action for U.S. Appl. No. 13/764,698 dated Jul. 11, 2013, 8 pages.
Office Action for U.S. Appl. No. 13/764,698 dated May 21, 2014, 14 pages.
Office Action for U.S. Appl. No. 14/072,657 dated Jun. 17, 2014, 7 pages.
Shin, et al. "Effect of Native Oxide on Polycrystalline Silicon CMP", Journal of the Korean Physical Society, Mar. 2009, pp. 1077-1081, vol. 54, No. 3, 5 pages.

(56) References Cited

OTHER PUBLICATIONS

Suehle, et al. "Temperature Dependence of Soft Breakdown and Wearout in Sub-3 nm SiO2 Films", IEEE 38 Annual International Reliability Physics Symposium, 2000, pp. 33-34, San Jose, California, 7 pages.
Office Action for U.S. Appl. No. 14/109,415 dated Aug. 24, 2015, 6 pages.
Corrected Notice of Allowance for U.S Appl. No. 12/861,666, dated Feb. 21, 2013, 2 pages.
Office Action for U.S. Appl. No. 14/455,822 dated Jan. 23, 2015, 7 pages.
Office Action for U.S. Appl. No. 14/455,822 dated Aug. 19, 2015, 7 pages.
Notice of Allowance for U.S. Appl. No. 13/249,115 dated May 12, 2014, 9 pages.
Corrected Notice of Allowance for U.S Appl. No. 13/249,115 dated Aug. 26, 2014, 11 pages.
Corrected Notice of Allowance for U.S Appl. No. 13/733,828 dated Nov. 18, 2013, 5 pages.
Notice of Allowance for U.S. Appl. No. 12/861,666, dated Feb. 21, 2013, 4 pages.
Office Action for U.S. Appl. No. 12/861,432 dated Jan. 8, 2014, 13 pages.
Office Action for U.S. Appl. No. 12/861,432 dated Mar. 29, 2013, 12 pages.
Office Action for U.S. Appl. No. 12/861,650 dated Jan. 25, 2012, 10 pages.
Office Action for U.S. Appl. No. 12/861,650 dated Oct. 16, 2012, 9 pages.
Office Action for U.S. Appl. No. 12/894,098 dated Aug. 1, 2012, 22 pages.
Office Action for U.S. Appl. No. 13/077,941 dated Aug. 12, 2013, 11 pages.
Office Action for U.S. Appl. No. 13/149,653 dated Apr. 25, 2012, 15 pages.
Office Action for U.S. Appl. No. 13/149,653 dated Nov. 20, 2012, 17 pages.
Office Action for U.S. Appl. No. 13/156,232 dated Nov. 26, 2012, 8 pages.
Office Action for U.S. Appl. No. 13/174,264 dated Mar. 6, 2013, 7 pages.
Office Action for U.S. Appl. No. 13/189,401 dated Sep. 30, 2013, 11 pages.
Office Action for U.S. Appl. No. 13/314,513 dated Mar. 27, 2012, 4 pages.
Office Action for U.S. Appl. No. 13/417,135 dated Oct. 9, 2012, 9 pages.
Office Action for U.S. Appl. No. 13/434,567 dated Feb. 6, 2014, 16 pages.
Office Action for U.S. Appl. No. 13/436,714 dated Aug. 27, 2013, 10 pages.
Office Action for U.S. Appl. No. 13/436,714 dated Dec. 7, 2012, 9 pages.
Office Action for U.S. Appl. No. 13/462,653 dated Sep. 30, 2013, 10 pages.
Office Action for U.S. Appl. No. 13/465,188 dated Mar. 19, 2013, 9 pages.
Office Action for U.S. Appl. No. 13/466,008 dated Jul. 29, 2013, 13 pages.
Office Action for U.S. Appl. No. 13/586,815 dated Jan. 29, 2014, 11 pages.
Office Action for U.S. Appl. No. 13/594,665 dated Aug. 2, 2013, 13 pages.
Office Action for U.S. Appl. No. 13/625,817 dated Feb. 28, 2014, 10 pages.
Office Action for U.S. Appl. No. 13/679,976 dated Mar. 6, 2013, 6 pages.
Office Action for U.S. Appl. No. 13/725,331 dated May 20, 2013, 7 pages.
Office Action for U.S. Appl. No. 13/739,283 dated Jan. 16, 2014, 11 pages.
Office Action for U.S. Appl. No. 13/870,919 dated Apr. 3, 2014, 19 pages.
Office Action for U.S. Appl. No. 13/920,021 dated Jan. 10, 2014, 7 pages.
Office Action for U.S. Appl. No. 13/143,047 dated Apr. 11, 2014, 11 pages.
Office Action for U.S. Appl. No. 13/167,920 dated Mar. 12, 2014, 14 pages.
Office Action for U.S. Appl. No. 13/761,132 dated Apr. 25, 2014, 5 pages.
Owen et al., "Electronic switching in amorphouse silicon devices: properties of the conductig filament", proceedings of the 5th International Conference o Solid-State and Integrated Cicuit Technology, 1998, pp. 830-833.
Owen, et al. "New Amorphous-silicon electrically programmable nonvolatile switching device," Solid-State and Electron Devices, IEEE Proceedings I, Apr. 1982, pp. 51-54, vol. 129, No. 2.
Lecomber et al., "The Switching Mechanism in Amorphous Silicon Junctions", Journal of Non-Crystalline Solids 77&78, 1985, pp. 1373-1382, North-Holland, Amsterdam.
Rose, et al, "Amorphous Silicon Analogue Memory Devices", Journal of Non-Crystalline Solids 115, 1989, pp. 168-170, Elsevier Science Publishers B.V., North-Holland.
Hudgens, et al., "Overview of Phase-Change Chalcogenide Nonvolatile Memory Technology", MRS Bulletin, Nov. 2004, pp. 829-832, www.mrs.org/publications/bulletin.
Zankovych et al., "Nanoimprint Lithography: Challenges And Prospects", Institute of Physics Publishing, Nanotechnology 12, 2001, pp. 91-95.
Lee, et al., "Full Integration And Cell Characteristics For 64Mb Novolatile PRAM", 2004 Symposium on VLSI Technology Dgest of Technical Papers, pp. 20-21, 2004 IEEE.
Chou, et al., "Imprint Lithography With 25-Nanometer Resolution", Science, Apr. 5, 1996, pp. 85-87, vol. 272.
Stikeman, "Polymer Memory—The Plastic Path to Beller Data Storage", Technology Review, Sep. 2002, p. 31, www.technologyreview.com.
Sune, et al., "Nondestructive Multiple Breakdown Events in Very Thin SiO2 Films", Applied Physics Letters, 1989, vol. 55 No. 128.
Supplemental Notice of Allowance for U.S.Appl. No. 12/894,087 dated Jan. 11, 2013, 2 pages.
Ugo, et al., "Self Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Den Boer, "Threshold Switching in Hydrogenated Amorphous Silicon", American Institute of Physics, 1982, pp. 812-813.
Waser, et al., "Nanoionics-based Resistive Switching Memories", Nature Materials, Nov. 2007, pp. 833-835, vol. 6.
Lu et al, "Nanoelectronics from the bottom up", Nature Materials—Review Articles, Insight, www.nature.com/naturematerials, Nov. 2007, pp. 841-850, vol. 6, Nature Publishing Group.
Lu et al., "Supporting Information", 2008.
Written Opinion of the International Searching Authority for PCTIUS2009/060023 filed on Oct. 9, 2009.
Written Opinion of the International Searching Authority for PCT/US2009/061249 filed on Oct. 20, 2009.
Written Opinion of the International Searching Authority for PCT/US2011/040090 filed on Jun. 10, 2011.
Written Opinion of the International Searching Authority for PCT/US2011/045124 filed on Jul. 22, 2011.
Avila et al., "Switching in Coplanar Amorphous Hydrogenated Silicon Devices", Solid-State Electronics 44, 2000, pp. 17-27.
Owen et al., "Memory Switching in Amorphous Silicon Devices", Journal of Non-Crystalline Solids 59 & 60, 1983, pp. 1273-1280, North-Holland Publishing Company.
Owen et al., "Switching in Amorphous Devices", Int. J. Electronics, 1992, pp. 897-906, vol. 73, No. 5.
Alamo et al., "Operating limits of Al-alloyed high-low junction for BSF Solar cells", Solid-State Electronics, 1981, pp. 415-420, vol. 24, Pergamon Press Ltd., Great Britain.

(56) References Cited

OTHER PUBLICATIONS

Dehon, "Array-Based Architecture for FET-Based, Nanoscale Electronics", IEEE Transactions on Nanotechnology, Mar. 2003, pp. 23-32, vol. 2, No. 1.
Cagli et al., "Evidence for Threshold Switching in the set pocess of NiO-based RRAM and Physical modeling for set, reset, retention and disturb prediction", IEEE International Electron Devices Meeting, Dec. 15-17, 2008, pp. 1-4, San Francisco, CA.
Chang et al., "Aluminum spiking at contact windows in Al/Ti-W/Si", Appl. Phys. Lett., Jan. 25, 1988, pp. 272-274, vol. 52, No. 4, American Institute of Physics.
Chen et al., "Nanoscale molecular-switch crossbar circuits," Nanotechnology 14, 2003, pp. 462-468, vol. 1.14, Institute of Physics Publishing.
Choi, "Molecular Electronic Crossbar Memory Circuits", Bistable (2)Rotaxane Based Molecular Electronics: Fundamentals and Applications, Chapter 3, pp. 79-124, Dissertion, California Institute of Technology.
Collier et al., "Electronically Configurable Molecular-Based Logic Gates", Science, Jul. 16, 1999, pp. 391-395, vol. 285, No. 5426.
Comber, "Present and Future Applications of Amorphous Silicon and Its Alloys", Journal of No-Crystalline Solids 115, 1989, pp. 1-13, Elsevier Science Publishers B.V., North-Holland.
Corrected Notice of Allowance for U.S Appl. No. 12/861,666 dated Jan. 11, 2013, 2 pages.
Corrected Notice of Allowance for U.S Appl. No. 13/733,828 dated Oct. 1, 2013, 5 pages.
Dey, "Electrothermal model of switching in amorphous silicon films", J. Vac. Sci. Technol., Jan/Feb. 1980, pp. 445-448, vol. 17, No. 1, American Vacuum Society.
Dong et al., "Si/a-Si Core/Shell Nanowires as Nonvolatile Crossbar Switches", Nano Letters, Jan. 2008, pp. 386-391, vol. 8, No. 2.
European Search Report for Application No. EP09819890.6 of Mar. 27, 2012, 3 pages.
European Search Report for Application No. EP11005207.3 of Oct. 12, 2011, 2 pages.
Ex Parte Quayle Action for U.S. Appl. No. 12/826,653 dated May 8, 2012, 8 pages.
Gangopadhyay, et al., "Memory Switching in Sputtered Hydrogenated Amorphous Silicon (a-Si:H)", Japanese Journal of Applied Physics, Short Notes, 1985, pp. 1363-1364, vol. 24, No. 10, Jpn. J. Appl. Phys.
Muller, et al., "Status and Outlook of Emerging Nonvolatile Memory Technologies", IEEE, 2004, pp. 567-570.
Hajto et al., "Amorphous & Microcrystalline Semiconductor Devices: Volume 2, Materials and Device Physics", Mar. 1, 2004, pp. 640-700, Artech House Publishers.
Hajto et al., "Analogue memory and ballistic electron effects in metal-amorphous silicon structures," Philosophical Magazine B, 1991, pp. 349-369, vol. 63, No. 1, Taylor & Francis Ltd.
Hajto et al., "The Programmability of Amorphous Silicon Analogue Memory Elements", Mat. Res. Soc. Symp. Proc. 1990, pp. 405-410, vol. 192, Materials Research Society.
Goronkin et al., "High Performance Emergin Solid-State Memory Technologies", MRS Bulletin, Nov. 2004, pp. 305-813, www.mrs.org/publications/bulletin.
Holmes et al., Design of Analogue Synapse Circuits using Non-Volatile a-Si:H Memory Devices, Proceedings of ISCAS, 1994, pp. 351-354.

Hu et al., "AC Characteristics of Cr/p/sup +/A-Si:HIV Analog Switching Devices." IEEE Transactions on Electron Devices, Sep. 2000, pp. 1751-1757, vol. 47, No. 9.
Hyun, "Nanoscale Memristive Devices for Memory and Logic Applcations", Thesis, University of Michigan, 2010.
International Search Report and Written Opinion for PCT/US2009/060023, filed on Oct. 8, 2009.
International Search Report and Written Opinion for PCT/US2011/046035, filed on Jul. 29, 2011, 3 pages.
International Search Report and Written Opinion for PCT/US2012/040242, filed May 31, 2012, 4 pages.
International Search Report and Written Opinion for PCT/US2012/045312, filed on Jul. 2, 2012, 4 pages.
International Search Report and Written Opinion for PCT/US2013/061244, filed on Sep. 23, 2013, 3 pages.
International Search Report and Written Opinion for PCT/US2013/077628, filed on Dec. 23, 2013, 5 pages.
International Search Report for PCT/US20091061249, filed on Oct. 20, 2009, 3 pages.
International Search Report for PCT/US20111040090 filed on Jun. 10, 2011.
International Search Report for PCT/US20111045124 filed on Jul. 22, 2011, 3 pages.
Scott, "Is There an Immortal Memory?", www.sciencemag.org, Apr. 2, 2004, pp. 62-63, vol. 304, No. 5667.
Hu et al., "Area-Dependent Switching in Thin Film-Silicon Devices", Materials Research Society Proceedings, 2003, pp. A18. 3.1-A18.3. 6, vol. 762, No. 1, Cambridge University Press.
Hu et al., "Switching and Filament Formation in Hot-Wire CVD P-Type A-Si:H Devices", Science Direct, Thin Solid Films 430, 2003, pp. 249-252, www.sciencedirect.com.
Jo et al, "A Silicon-Based Crossbar Ultra-High-Density Non-Volatile Memory", SSEL Annual Report 2007.
Jo et al, "Nonvolatile Resistive Switching Devices Based on Nanoscale Metal/Amorphous Silicon/Crystalline Silicon Junctions," Mater. Res. Soc Symp Proc., 2007, vol. 997, Materials Research Society.
Jo et al. "Experimental, Modeling and Simulation Studies of Nanoscale Resistance Switching Devices," 2009, IEEE.
Jo et al., "Ag/a-Si:H/c-Si Resistive Switching Nonvolatile Memory Devices", 2006.
Jo et al., "CMOS Compatible Nanoscale Nonvolatile Resistance Switching Memory," Nano Letters, 2008, pp. 392-397, vol. 8, No. 2, American Chemical Society Publications.
Jo et al., "High-Density Crossbar Arrays Based on a Si Memristive System", Nano Letters, 2009, pp. 870-874, vol. 9, No. 2, American Chemical Society Publications.
Jo et al., "High-Density Crossbar Arrays Based on a Si Memristive System", Supporting Information, 2009, pp. 1-4.
Jo et al., "Nanoscale Memristor Device as Synapse in Neuromorphic Systems", Nano Letters, 2010, pp. 1297-1301, Pubs.acs.org/NanoLett, A-E, American Chemical Society Publications.
Jo et al., "Programmable Resistance Switching in Nanoscale Two-Terminal Devices," Nano Letters 2009, pp. 496-500, vol. 9, No. 1, American Chemical Society Publications.
Jo et al., "Programmable Resistance Switching in Nanoscale Two-Terminal Devices," Supporting Information, Dec. 29, 2008, pp. 1-4, vol. 9, No. 1, Department of Electrical Engineering and Computer Science, the University pf Michigan, Ann Arbor, Michigan.
Jo et al., Si-Based Two-Terminal Resistive Switching Nonvolatile Memory, 2008, IEEE.

* cited by examiner

METHOD FOR SILVER DEPOSITION FOR A NON-VOLATILE MEMORY DEVICE

CROSS-REFERENCE TO RELATED APPLICATIONS

The present application claims priority to and is a continuation-in-part of the following: U.S. patent application Ser. No. 13/620,012, filed on Sep. 14, 2012, U.S. patent application Ser. No. 14/109,415, filed on Dec. 17, 2013, and U.S. patent application Ser. No. 14/455,822, filed on Aug. 8, 2014. All of these applications are incorporated by reference herein for all purposes.

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

SUMMARY OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability In a specific embodiment, a method for forming a resistive switching device for a non-volatile memory device is provided. The method includes providing a substrate having a surface region. A first dielectric material is deposited overlying the surface region and a first wiring structure is formed overlying the first dielectric material. The method includes forming a junction material overlying the first wiring structure. In a specific embodiment, the method includes forming a resistive switching material overlying the junction material. The resistive switching material can be a silicon material having an intrinsic semiconductor characteristic in a specific embodiment. The method then subjects a stack material comprising at least the junction material and the resistive switching material to a first patterning and etching process to form a first structure. The first structure includes at least the junction material and the resistive switching material in a specific embodiment. The first structure further includes a surface region comprising a surface region of the resistive switching material. A second dielectric material is formed overlying the first structure and a thickness of second dielectric material overlying the first structure. In a specific embodiment, the method forms an opening structure in portions of the second dielectric material to expose a portion of the surface region of the resistive switching material. The method includes forming a catalytic material overlying at least the resistive material in a first portion of the opening structure and forming a silver material conformally overlying the resistive switching material in the opening structure from a solution. The solution includes at least a silver species in a reaction bath and characterized by an alkaline pH to cause the catalytic material to solubilize while forming the silver material. The method forms a second wiring structure overlying the silver material and exposed surface of the second dielectric material.

Many features are observed by ways of embodiments of the present invention over conventional techniques. For example, embodiments according to the present invention provide a method to form an active conductive material for a resistive switching device. The active conductive material can include noble metal such as silver, gold, palladium, platinum, and others which has a suitable diffusion characteristic in the resistive switching material caused by a presence of a suitable electric field. The present method of forming the active conductive material structure is free from a dry etch process (for example, reactive ion etching, or RIE), which is challenging, as the noble metals do not form a volatile species. Additionally, the present method can e realized using conventional processing equipments without modification. Depending on the embodiment, one or more of these benefits may be achieved. One skilled in the art would recognized other modifications, variations, and alternatives.

According to one aspect of the invention, a method for forming a non-volatile memory device is described. One technique includes depositing a first dielectric layer overlying a surface region of a substrate, forming a first wiring structure overlying the first dielectric material, forming a junction layer overlying the first wiring structure, and forming a resistive switching layer overlying the junction layer. One process includes subjecting a stack layer comprising at least the junction layer, the resistive switching layer to a first patterning and etching process to form a first structure comprising at least the junction layer and the resistive switching layer, the first structure comprising a surface region comprising a surface region of the resistive switching layer, forming a second dielectric layer overlying the first structure and forming a second dielectric layer overlying the first structure, wherein the second dielectric layer comprises a controlled thickness above the surface region, and forming an opening structure in portions of the second dielectric layer to expose a portion of the surface region of the resistive switching layer. One method includes forming a first metal layer comprising first metal material overlying at least the portion of the surface region of the resistive switching layer within a portion of the opening structure, forming a silver layer overlying at least the portion of the surface region of the resistive switching layer in the opening structure, wherein the silver layer is derived from a solution comprising at least a silver species in a reaction bath, wherein the solution comprises an alkaline pH to cause silver species of the solution to be reduced by the first metal material, and wherein the first metal layer is solubilized while forming the silver material, and forming a second wiring structure overlying the silver layer and an exposed surface of the second dielectric layer.

According to another aspect of the invention, a method of depositing a silver material layer is described. One process includes forming a plurality of openings in a dielectric layer to expose a top surface of a structure comprising a resistive memory layer on top of a p-doped silicon-containing layer on top of a conductive structure, and depositing a first metal layer comprising a tungsten layer overlying the top surface of the structure, wherein a first metal material of the first metal layer contacts a resistive memory material of the resistive memory layer. One technique includes exposing the first metal layer in a bath comprising a solution of silver species having an alkaline pH for a predetermined time to form a silver metal layer from the silver species from the solution overlying the resistive memory material, wherein the silver species is reduced by the first metal material, and wherein the first metal material is solubilized while forming the silver metal layer.

According to yet another aspect of the invention, a product manufactured according to any of the herein disclosed techniques is described.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are direct to resistive switching devices. More particularly, embodiments according to the present invention provide a method and a device structure for fabricating a resistive switching device. The resistive switching device has been used in a non-volatile memory device, but it should be recognized that embodiments according to the present invention can have a much broader range of applicability.

Resistive switching device exploits a unique property of electrical resistance change upon application of an electric field of certain non-conductive materials. A resistive switching device using a silicon material as the resistive switching material has an advantage of complete compatibility with current CMOS processing techniques. To change the resistance of the resistive switching material, a conductive material is provided in direct contact with the resistive switching material. The conductive material is characterized by a suitable diffusivity in the resistive switching material upon application of an appropriate electric field. Diffusion due to thermal effect or mass transfer should be insignificant compared to diffusion due to the electrical effect. The electric filed can be provided by applying a voltage or a current to the resistive switching device. For resistive switching device using silicon material as the resistive switching material, metal material such as silver, gold, palladium, platinum, aluminum, and others may be used. Silver material has the desirable diffusivity characteristic in amorphous silicon resistive switching material in presence of an electric field. Due to high mobility and surface characteristic of silver, deposition of silver onto a semiconductor surface and to fill a small area of opening can be challenging. Additionally, resistive ion etching of silver may not be possible due to lack of volatile species derived from silver. Accordingly, embodiments of the present invention provide a method and a device structure for a resistive switching device using amorphous silicon material as the resistive switching material and a silver material as an active conductive material.

Figure 1:
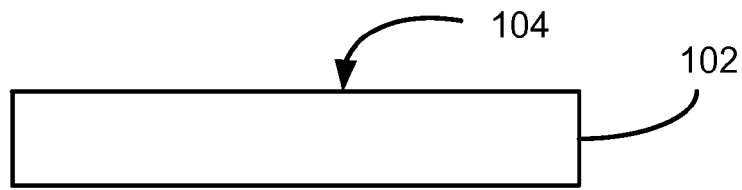
FIG. 1 is a simplified diagram illustrating a fabrication step according to various embodiments of the present invention.

As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon or therein. The one or more MOS devices can be controlling circuitry for the resistive switching device, or the like in some embodiments.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 2:
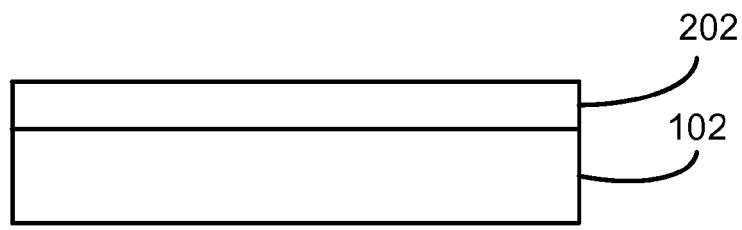
FIG. 2 is a simplified diagram illustrating a fabrication step according to various embodiments of the present invention.

As illustrated in FIG. 2, embodiments of the method include depositing a first dielectric material 202 overlying the semiconductor substrate 102. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 3:
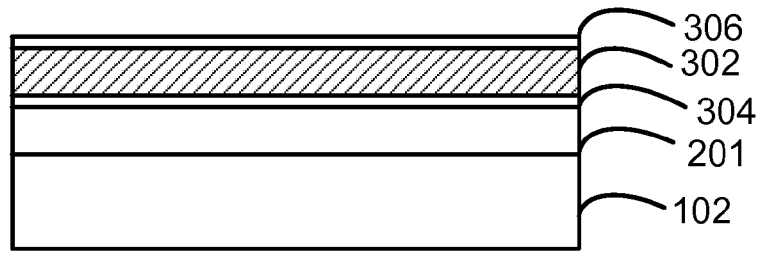
FIG. 3 is a simplified diagram illustrating a fabrication step according to various embodiments of the present invention.

Referring to FIG. 3, embodiments of the method include depositing a first wiring material 302 overlying the first dielectric material. First wiring material 302 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 304 is first formed overlying the first dielectric material 302 before deposition of the first wiring material 302 to promote adhesion of the first wiring material 302 to the first dielectric material 202. A diffusion barrier material 306 may also be formed overlying the first wiring material 302 to prevent, for example, the conductive material, the metal material, gasses, oxygen, or the like to contaminate other portions of the device in a specific embodiment.

Figure 4:
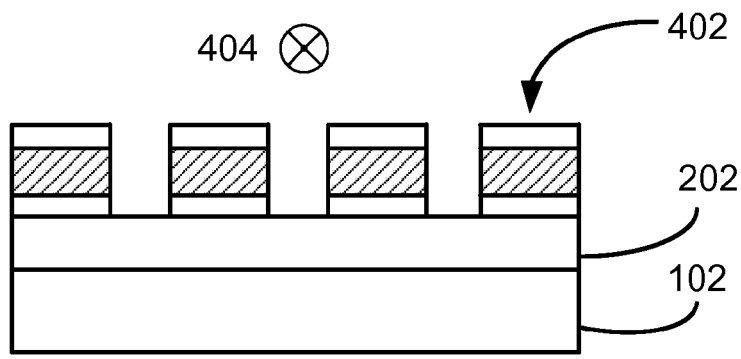
FIG. 4 is a simplified diagram illustrating a fabrication step according to various embodiments of the present invention.
Figure 5:
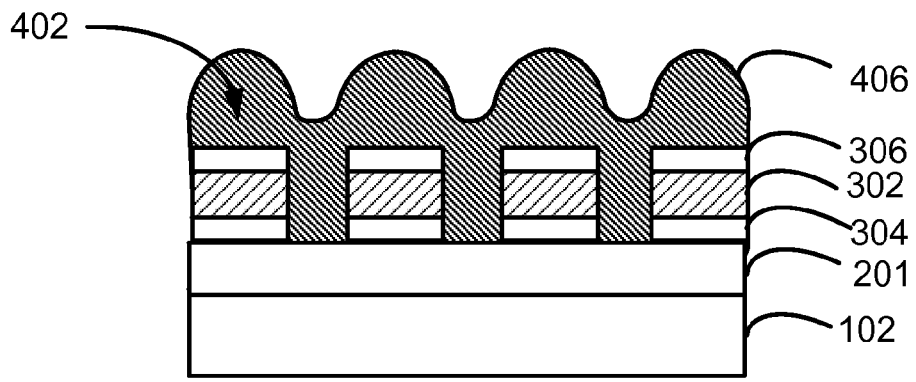
FIG. 5 is a simplified diagram illustrating a fabrication step according to various embodiments of the present invention.

In FIG. 4, an embodiment of the method subjects the first wiring material (302, 304 and 306) to a first pattern and etching process to form a first wiring structure 402 in a specific embodiment. As shown in FIG. 4, the first wiring structure 402 includes a plurality of first elongated structures configured to extend in a first direction 404 (into and out of the page) in a specific embodiment. In a specific embodiment, the method deposits a second dielectric material 406 overlying the first wiring structure, as illustrated in FIG. 5. The second dielectric material 406 can be silicon oxide, silicon nitride, a dielectric stack of alternating layers of silicon oxide and silicon nitride (for example, an ONO stack), a low K dielectric, a high K dielectric, or a combination, and others, depending on the application.

Figure 6:
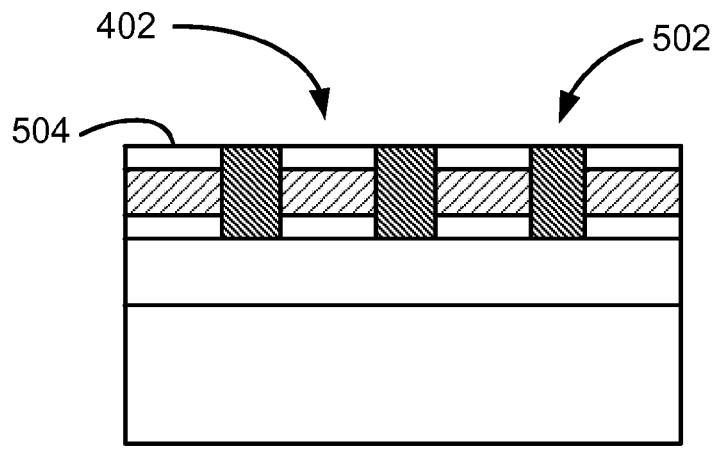
FIG. 6 is a simplified diagram illustrating a fabrication step according to various embodiments of the present invention.

As illustrated in FIG. 6, second dielectric material 406 can be subjected to a planarizing process to isolate the first wiring structures 402 in a specific embodiment. The planarizing process can be a chemical mechanical polishing process or an etch back process, a combination thereof, and others depending on the application. As shown in FIG. 6, a surface region 504 of the diffusion barrier material is exposed, and second dielectric material 406 remains in the spaces 502 between first wiring structure 402.

Figure 7:
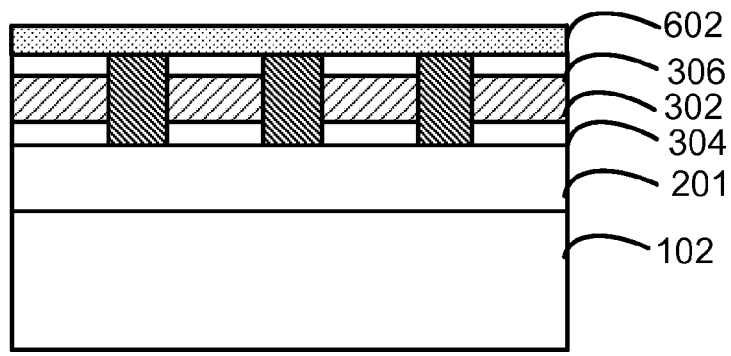
FIG. 7 is a simplified diagram illustrating a fabrication step according to various embodiments of the present invention.

Referring to FIG. 7, embodiments of the present invention includes a step of depositing a junction material 602 overlying the first wiring structure 402 and exposed surface region 504 of the second dielectric material 306. In various embodiments, junction material 602 can be a conductive p-doped silicon containing material, polycrystalline silicon material having a p+ impurity characteristic or a polycrystalline silicon germanium material having a p+ impurity characteristic, or a combination thereof. Junction material 602 can be deposited using techniques such as a chemical vapor deposition process including low pressure chemical vapor deposition process, plasma-enhanced chemical vapor deposition process, using silicon precursor such as silane ($SiH_4$), disilane ($Si_2H_6$), or a chlorosilane in a suitable reducing environment depending on the embodiment. Deposition temperature ranges from about 380 Degree Celsius to about 450 Degree Celsius and not greater than about 440 Degree Celsius depending on the application. Alternatively, junction material 602 can be deposited using a physical vapor deposition process from a suitable silicon target. In a specific embodiment, junction material 602 can be deposited using a low pressure chemical vapor deposition process using disilane at a deposition temperature ranging from about 400 Degree Celsius to about 460 Degree Celsius. In some embodiments, junction material 602 is configured to have the polycrystalline characteristic as deposited free from an anneal process.

Figure 8:
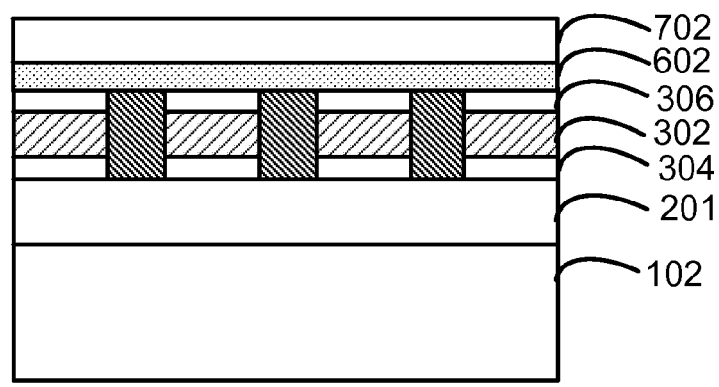
FIG. 8 is a simplified diagram illustrating a fabrication step according to various embodiments of the present invention.

Referring to FIG. 8, in some embodiments, the method deposits a resistive switching material 702 overlying junction material 602 (for example, the polycrystalline silicon having the p+ impurity characteristic). The resistive switching material 702 can include a suitable insulator material having a resistance that can be altered upon application of an electric field to the insulator material. In a specific embodiment, the resistive switching material 702 can include a silicon material. For example, the silicon material can be an amorphous silicon material, a microcrystalline silicon material, a macro crystalline silicon material, a silicon germanium material, a silicon oxide, and including any combination of these. In some embodiments, the silicon material includes an amorphous silicon material.

The resistive switching material 702 is characterized by a state, for example, a resistance state dependent on an electric field in the switching material. In a specific embodiment, the switching material 702 is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In another embodiment, the resistive switching material/amorphous silicon material 702 may be formed from an upper region of a p+ polycrystalline silicon or p+ silicon germanium bearing layer (e.g. 602) using an Argon, Silicon, Oxygen plasma etch, or the like. For instance, a plasma etch may use a bias power within a range of approximately 30 watts to approximately 120 watts to convert an upper region of the polysilicon or silicon germanium material 602 into a non-conductive amorphous silicon 702 having p-type impurities (from the original polycrystalline silicon or silicon germanium bearing layer 602). In some embodiments, resistive e switching material 702 may be on the order of about 2 nm to about 5 nm.

Figure 9:
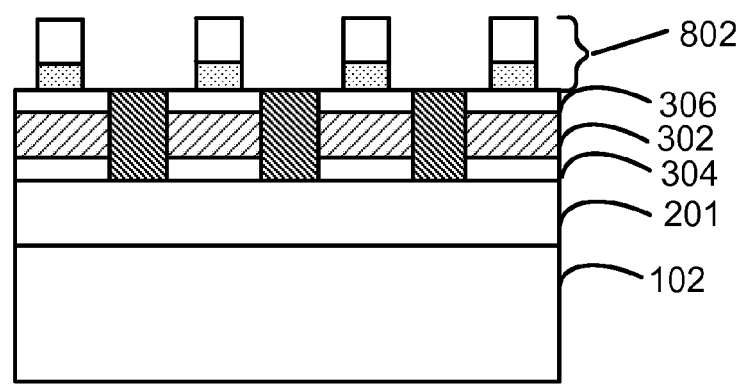
FIG. 9 is a simplified diagram illustrating a fabrication step according to various embodiments of the present invention.

In various embodiments, as illustrated in FIG. 9, resistive switching material 702 and junction material 602 are subjected to a patterning and etching process to form one or more first structures 802 substantially free from side wall contamination (e.g. silver). As shown, each of the one or more first structures comprises 802 includes at least resistive switching material 702 and junction material 602. In various embodiments, each of the one or more first structures 802 are configured to be in physical and electrical contact with first wiring structures 402.

Figure 10:
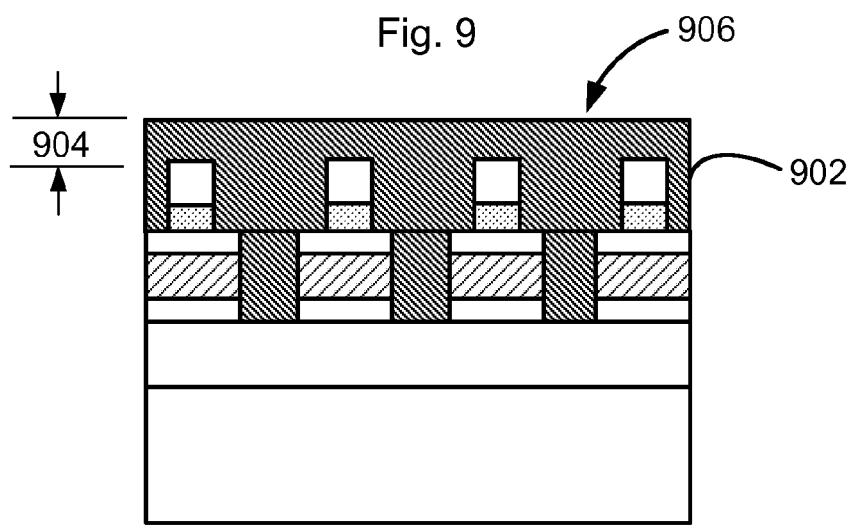
FIG. 10 is a simplified diagram illustrating a fabrication step according to various embodiments of the present invention.

Referring to FIG. 10, a third dielectric material 902 is formed overlying the first structures 802 to fill a gap 906 between each of the first structures 802. Third dielectric material 902 can include silicon oxide, silicon nitride, a dielectric stack of alternating layers of silicon oxide and silicon nitride (for example, an ONO stack), a low K dielectric, a high K dielectric, or a combination, and others, depending on the application. Third dielectric material 902 further forms a layer 904 having a controlled thickness overlying each of the first structures 802, as shown.

Figure 11:
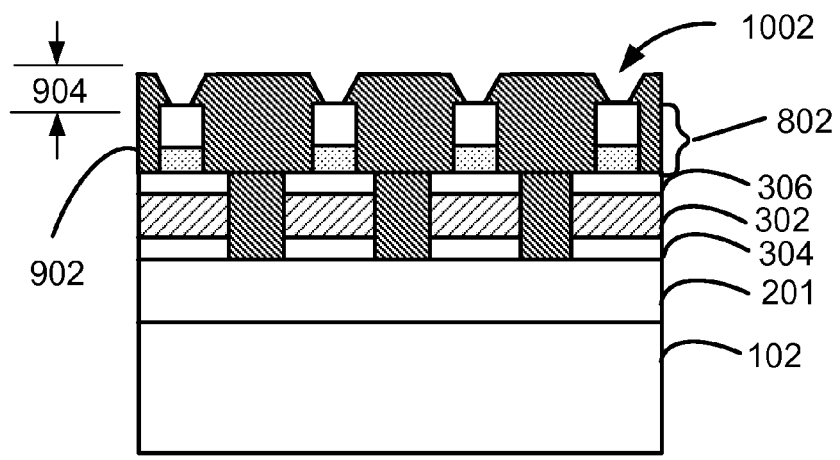
FIG. 11 is a simplified diagram illustrating a fabrication step according to various embodiments of the present invention.
Figure 12:
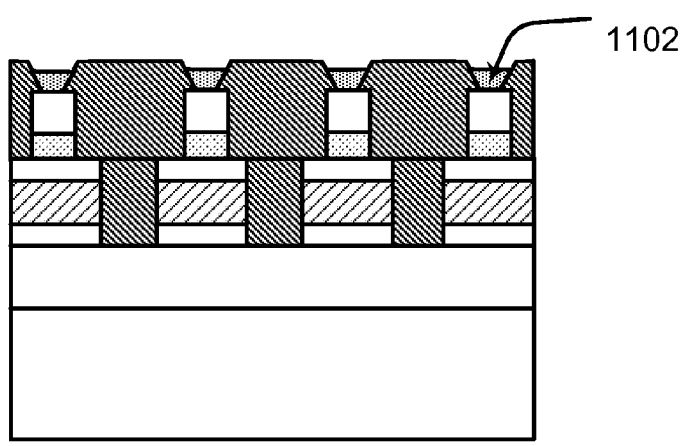
FIG. 12 is a simplified diagram illustrating a fabrication step according to various embodiments of the present invention.

Referring to FIG. 11, in various embodiments, the method include subjecting third dielectric material 902 to a patterning and etch process to form an opening structure 1002. As illustrated, opening structure 1002 in layer 904 of third dielectric material 902 overlies first structures 802. In various embodiments, opening structure 1002 exposes a top surface region of first structure 802, more specifically, a top surface region of resistive switching material 702, as shown. In other embodiments, the top surface region of the resistive switching material 702 may first be provided with a thin layer of titanium, or the like, that protects resistive switching material 702 during the following steps.

As illustrated in the example in FIG. 11, the method includes depositing an active conductive material 1102 at least in the opening structure 1002 overlying the resistive switching material 702 as shown in FIG. 11. In various embodiments, the active conductive material 1102 may be deposited using a physical vapor deposition process, a chemical vapor deposition process, an electrochemical (for example electroplating), and an electroless deposition process and others, depending on the application.

In a specific embodiment, active conductive material 1102 can be deposited overlying the resistive switching material 702 using an electroless deposition process. The electroless deposition process includes first forming a first metal material to promote formation of the active conductive material overlying the resistive switching material 702. For amorphous silicon material as the resistive switching material 702 and silver material as the active conductive material 1102, the first metal material can be cobalt, copper, tungsten, ruthenium, and others. These metal materials can be deposited using techniques such as a physical vapor deposition process, a chemical vapor deposition process, an electrochemical deposition process, and others.

In some specific embodiments, for amorphous silicon material as resistive switching material 702 and silver material as the desired active conductive material 1102, the first metal material can be tungsten. Tungsten has an additional advantage of having complete compatibility with conventional silicon processing. Depending on the application, tungsten can be deposited using techniques such as physical vapor deposition process, chemical vapor deposition process, or a combination, and others. In a specific embodiment, the deposited tungsten is characterized by a thickness ranging from about 30 Angstroms to about 100 Angstroms and has a good fill in the opening structures 1002. In some embodiments, the deposited tungsten can have a thickness of about 40 Angstroms to about 70 Angstroms.

In some embodiment, the method includes subjecting the first metal material, for example, the tungsten material, to a solution comprising an active metal species (e.g. silver) to form an active metal material (e.g. silver) overlying the resistive switching material 702. In operation, the active metal species (e.g. silver) in the solution is reduced by the first metal material (e.g. tungsten) in an electroless deposition process. For silver as the active metal material, the electroless deposition process includes providing a silver species in a solution in a reaction bath. In a specific embodiment, the silver species comprises a silver oxide material in a solution.

In specific embodiments, a solution including a silver species is provided by TechniSol® Silvermerse™ by Technic Inc., of Rhode Island, USA. The solution is characterized by a pH greater than about 7, that is, an alkaline pH, in a specific embodiment. In certain embodiments, the pH can range from about 7.5 to about 11. In other embodiments, the pH of the solution can range from about 8 to about 9.8. The alkaline pH may be provided using a potassium hydroxide solution, or others, depending on the application. In certain embodiment, thermal energy can be applied to the reaction bath including the solution comprising the silver species to provide for a deposition temperature ranging from about 35 Degree Celsius to about 70 Degree Celsius or about 40 Degree Celsius to about 60 Degree Celsius, or the like depending on the application.

In various embodiments, the silver oxide concentration can range from about 3 percent to about 4 percent, or the like. The silver concentration in the reaction bath can be adjusted using deionized water. In other embodiments, the silver concentration in the reaction bath can be adjusted using an ethylenediamine solution, also supplied by Technic Inc., of Rhode Island, USA. In various embodiments, the solution is further characterized by a suitable surface tension to allow for deposition in an opening structure having small areas. In various embodiments, the deposited silver can have a silver thickness depending substantially on a deposition time, silver oxide concentration, temperature, pH, or the like.

In some embodiments, the as-deposited silver is then subjected to a rinsing step using deionized water or other suitable solvent to remove residual reaction species, for example, silver oxide, potassium hydroxide, or ethyleneamine, and others. Depending on the application, silver material deposited on a top surface of the third dielectric material 902 can be removed using a chemical mechanical polishing process, a polishing step, or the like, while the silver material remains isolated in the opening structure 1002 and in electrical and physical contact with the resistive switching material 702 in a specific embodiment.

In a specific embodiment, the first metal material (e.g. tungsten) is consumed during active conductor material (e.g. silver) deposition. In the case of silver deposition, the tungsten material is consumed and a substantially pure silver material is formed. In one example, the silver material was deposited on a silicon material, using TechniSol® Silvermerse™ and tungsten (about 50 Angstrom) was used as the reducing material. Deposition parameters were as follows:

Provide a silicon substrate,

Deposit about 50 Angstroms of tungsten using a physical vapor deposition process from a tungsten target material, Provide a solution comprising a silver oxide material and a potassium hydroxide in a reaction bath, the silver oxide material has a concentration of about 3-4% of silver oxide material, and the solution has a pH ranging from about 8-11.

Increase a temperature of the reaction bath ranging from about 40 Degree Celsius to about 60 Degree Celsius.

Immerse the silicon substrate including the tungsten material to the reaction bath comprises silver oxide material and potassium hydroxide solution for about 1 minute to about 15 minutes, Remove the silicon substrate having the silver material deposited from the reaction bath Subject at least the silver material to a rinsing process using deionized water.

Figure 13:
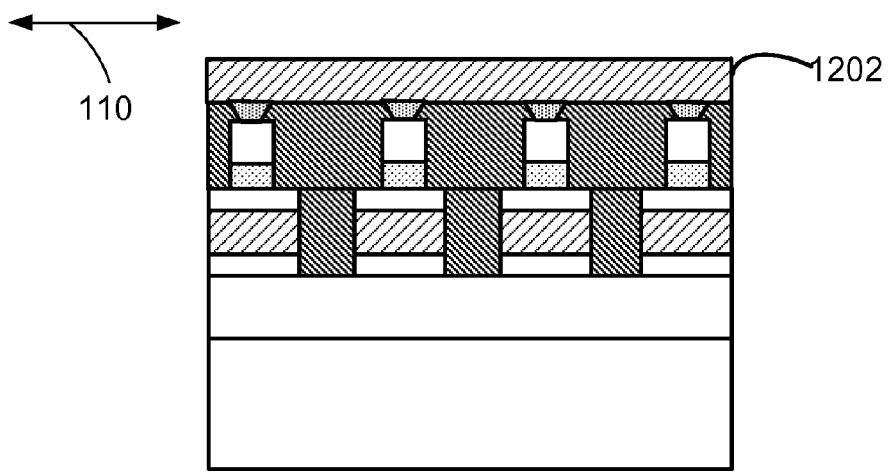
FIG. 13 is a simplified diagram illustrating a fabrication step according to various embodiments of the present invention.

In various embodiments, referring to FIG. 13, a second wiring material 1202 is formed overlying the third dielectric material 902 and contacting the silver in the opening structures 1002. The second wiring material can be tungsten, copper, aluminum, titanium, titanium oxide, or other suitable conductive material, depending on the application. The second wiring may be formed using a physical vapor deposition process, a chemical vapor deposition process, an electroplating process, an electroless deposition process, or a combination of theses, and others.

In various embodiments, the second wiring material 1202 is subjected to a patterning an etching process to form one or more second wiring structures. In various embodiments, the second wiring structure extends in direction 110, typically orthogonal to direction 440. Additionally, second wiring structure maintains a direct physical and electrical contact with the silver material in the opening structures, as shown. In some embodiments, the method continues to complete the device by forming isolating dielectric material and other passivation steps and others as would be recognized by one skilled in the art.

In various experiments described below, an electron microprobe analysis revealed that silver material deposited on a silicon substrate comprises about 97% silver and trace amount of oxygen, tungsten, and potassium.

Though the present invention has been exemplified in various embodiments, it is to be understood that the examples and embodiment described herein are for illustrative purpose only purposes only and that various modifications or alternatives in light thereof will be suggested to persons skilled in the art and are to be included within the spirit and purview of this application and scope of the appended claims.

What is claimed is:

1. A method for forming a non-volatile memory device, comprising:
    depositing a first dielectric layer overlying a surface region of a substrate;
    forming a first wiring structure overlying the first dielectric material;
    forming a junction layer overlying the first wiring structure;
    forming a resistive switching layer overlying the junction layer by converting an upper region of the junction layer to the resistive switching layer;
    subjecting a stack of layers comprising at least the junction layer and the resistive switching layer to a first patterning and etching process to form a first pillar-like structure comprising a portion of the junction layer and a portion of the resistive switching layer, the first pillar-like structure comprising a surface region of the resistive switching layer;
    forming a second dielectric layer having a controlled thickness overlying the surface region of the resistive switching layer;
    forming an opening in a portion of the second dielectric layer to expose a portion of the surface region of the resistive switching layer;
    forming a first metal layer comprising first metal material overlying at least the portion of the surface region of the resistive switching layer within the opening;
    forming a silver layer overlying the portion of the surface region of the resistive switching layer, wherein the silver layer is derived from a solution comprising at least a silver species in a reaction bath, wherein the solution comprises an alkaline pH to cause silver species of the solution to be reduced by the first metal material, and wherein the first metal layer is solubilized while forming the silver layer; and
    forming a second wiring structure overlying the silver layer.

2. The method of claim 1 wherein forming the silver layer further comprises providing thermal energy to the reaction bath to thereby increase a temperature of the reaction bath including the solution to a temperature ranging from about 38 Degree Celsius to about 75 Degree Celsius.

3. The method of claim 1 wherein forming the silver layer is an electroless deposition process.

4. The method of claim 1 wherein the solution comprises a silver oxide material, potassium hydroxide and water.

5. The method of claim 1
    further comprising forming a layer of titanium overlying and contacting at least a portion of the surface region of the resistive switching layer within the opening, and wherein forming the first metal layer comprises forming the first metal material overlying and contacting the layer of titanium within the opening.

6. The method of claim 1 wherein the junction layer is selected from a group consisting of: a p-doped polycrystalline silicon material, a p-doped polycrystalline silicon germanium material, and a p+ doped silicon-containing material.

7. The method of claim 1 wherein the resistive switching material is characterized by a thickness ranging from about 2 nm to about 5 nm.

8. The method of claim 7 wherein the first metal layer comprises a tungsten layer characterized by a thickness ranging from about 40 Angstroms to about 70 Angstroms.

9. The method of claim 1 wherein the resistive switching layer is selected from a group consisting of: a silicon material having an intrinsic semiconductor characteristic, an undoped amorphous silicon material, and a silicon and germanium material having an intrinsic semiconductor characteristic.

10. The method of claim 1 wherein the substrate comprises a plurality of MOS devices formed therein.

11. The method of claim 1, wherein forming the resistive switching layer further comprises subjecting the p-doped silicon-containing layer to a plasma etch that comprises oxygen.

12. A method of depositing a silver material layer comprising:
- forming a resistive memory layer from an upper region of a p-doped silicon-containing layer;
- forming a plurality of openings in a dielectric layer to expose a top surface of a structure that comprises the resistive memory layer on top of the p-doped silicon-containing layer on top of a conductive structure;
- depositing a first metal layer comprising a tungsten layer overlying the top surface of the structure; and
- exposing the first metal layer in a bath comprising a solution of silver species having an alkaline pH for a predetermined time to form a silver metal layer from the silver species from the solution overlying the resistive memory material, wherein the silver species is reduced by the first metal material, and wherein the first metal material is solubilized while forming the silver metal layer.

13. The method of claim 12 wherein depositing the first metal layer comprises performing a deposition process selected from a group consisting of: a physical vapor deposition process, a chemical vapor deposition process, an electrochemical deposition process, and an electroless deposition process.

14. The method of claim 12 wherein the solution of silver species comprises silver oxide, potassium hydroxide, and water.

15. The method of claim 12 further comprising:
- depositing a titanium layer overlying and contacting the top surface of the structure,
- wherein the depositing the first metal layer further comprises depositing the first metal layer overlying and contacting the titanium layer.

16. The method of claim 12 further comprising:
- forming the p-doped silicon-containing layer overlying and contacting the conductive structure.

17. The method of claim 12 wherein forming the resistive memory layer comprises subjecting the p-doped silicon-containing layer to a plasma etch.

18. The method of claim 17 wherein the plasma etch comprises oxygen.

19. The method of claim 12, wherein the resistive memory layer is selected from a group consisting of: a silicon material having an intrinsic semiconductor characteristic, an undoped amorphous silicon material, and a silicon and germanium material having an intrinsic semiconductor characteristic.

20. The method of claim 12 wherein the p-doped silicon-containing layer is selected from a group consisting of: a p-doped polycrystalline silicon material, a p-doped polycrystalline silicon germanium material, and a p+ doped silicon-containing material.

* * * * *